United States Patent
Frougier et al.

(10) Patent No.: US 10,784,171 B2
(45) Date of Patent: Sep. 22, 2020

(54) VERTICALLY STACKED COMPLEMENTARY-FET DEVICE WITH INDEPENDENT GATE CONTROL

(71) Applicant: GLOBALFOUNDRIES Inc., Grand Cayman (KY)

(72) Inventors: Julien Frougier, Albany, NY (US); Ruilong Xie, Niskayuna, NY (US); Puneet Harischandra Suvarna, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/577,032

(22) Filed: Sep. 20, 2019

(65) Prior Publication Data

US 2020/0035569 A1   Jan. 30, 2020

Related U.S. Application Data

(63) Continuation of application No. 16/047,456, filed on Jul. 27, 2018, now Pat. No. 10,510,622.

(51) Int. Cl.
   *H01L 21/84*      (2006.01)
   *H01L 27/12*      (2006.01)
   (Continued)

(52) U.S. Cl.
   CPC ........ *H01L 21/845* (2013.01); *H01L 21/8221* (2013.01); *H01L 21/823821* (2013.01);
   (Continued)

(58) Field of Classification Search
   CPC ............... H01L 21/845; H01L 21/8221; H01L 21/823821; H01L 21/823842;
   (Continued)

(56) References Cited

U.S. PATENT DOCUMENTS 5,010,386 A  *  4/1991  Groover, III ......... H01L 27/092
                                                257/328
9,640,636 B1     5/2017  Bentley et al.
                        (Continued)

FOREIGN PATENT DOCUMENTS

| TW | 201719901 A | 6/2017 |
| TW | 201743383 A | 12/2017 |
| TW | 201816856 A | 5/2018 |

OTHER PUBLICATIONS

Examination Report from Taiwan Patent Application No. 108122612 dated Dec. 23, 2019.

*Primary Examiner* — Dale E Page
*Assistant Examiner* — Quovaunda Jefferson
(74) *Attorney, Agent, or Firm* — Amerson Law Firm, PLLC

(57) ABSTRACT

A device is disclosed that includes a first transistor device of a first type and a second transistor device of a second type positioned vertically above the first transistor, wherein the first type and second type of transistors are opposite types. The device also includes a gate structure for the first transistor and the second transistor, wherein the gate structure comprises a first gate electrode for the first transistor and a second gate electrode for the second transistor and a gate stack spacer positioned vertically between the first gate electrode and the second gate electrode so as to electrically isolate the first gate electrode from the second gate electrode.

19 Claims, 19 Drawing Sheets

(51) Int. Cl.
  *H01L 27/092*   (2006.01)
  *H01L 21/822*   (2006.01)
  *H01L 21/8238*  (2006.01)
  *H01L 29/66*    (2006.01)

(52) U.S. Cl.
  CPC ........... *H01L 21/823842* (2013.01); *H01L 21/823864* (2013.01); *H01L 21/823878* (2013.01); *H01L 27/0924* (2013.01); *H01L 27/1211* (2013.01); *H01L 29/66545* (2013.01)

(58) Field of Classification Search
  CPC ..... H01L 21/823864; H01L 21/823878; H01L 27/0924; H01L 27/1211
  See application file for complete search history.

(56) References Cited

U.S. PATENT DOCUMENTS

| | | |
|---|---|---|
| 9,653,289 B1 | 5/2017 | Balakrishnan et al. |
| 9,831,346 B1 | 11/2017 | Zang et al. |
| 9,991,352 B1 | 6/2018 | Frougier et al. |
| 10,453,967 B2 | 10/2019 | Mehandru et al. |
| 2008/0160726 A1* | 7/2008 | Lim .................. H01L 21/02381 438/479 |
| 2009/0275179 A1* | 11/2009 | Basker ............ H01L 21/823842 438/231 |
| 2018/0374753 A1 | 12/2018 | Pawlak et al. |

\* cited by examiner

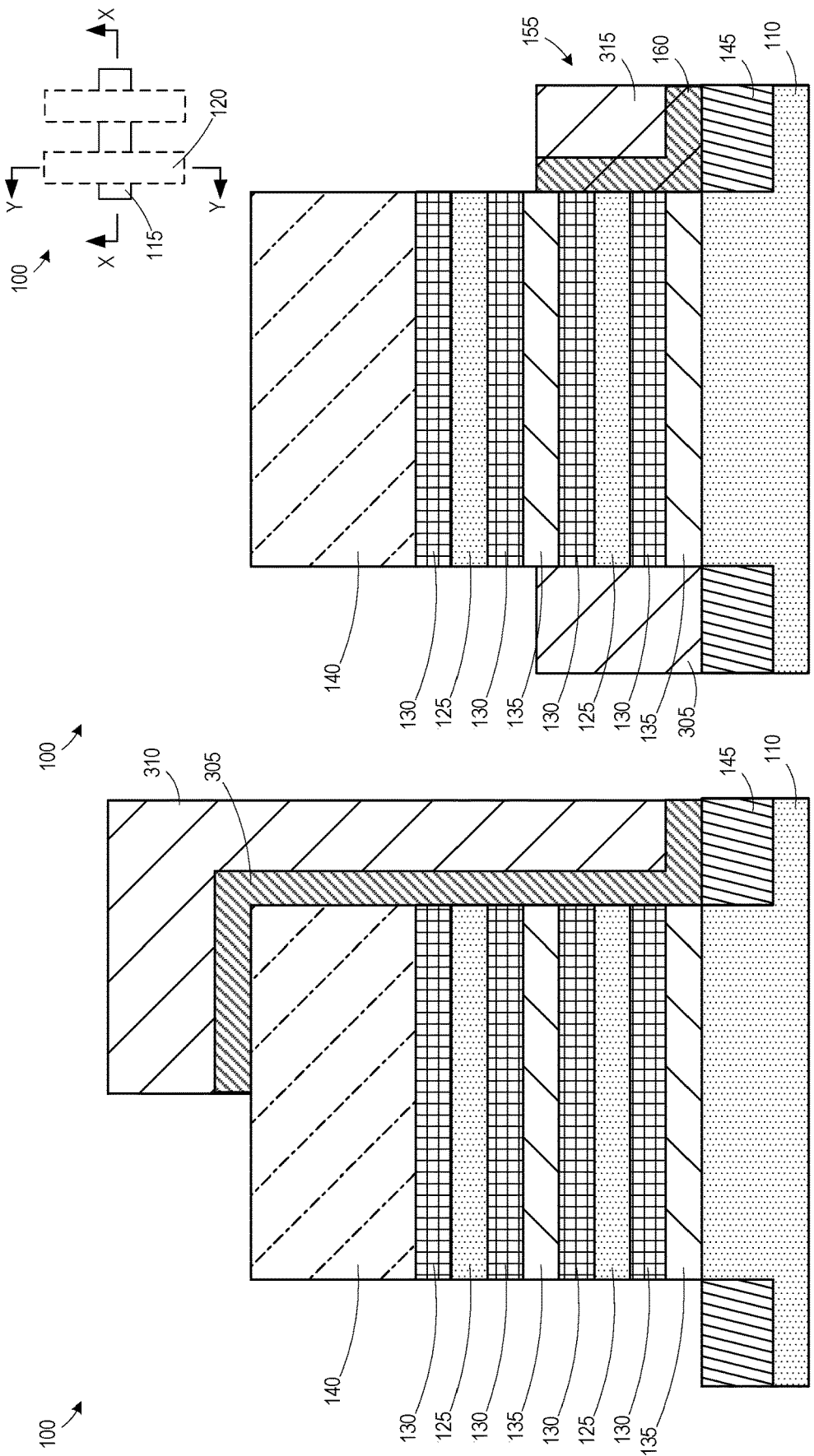

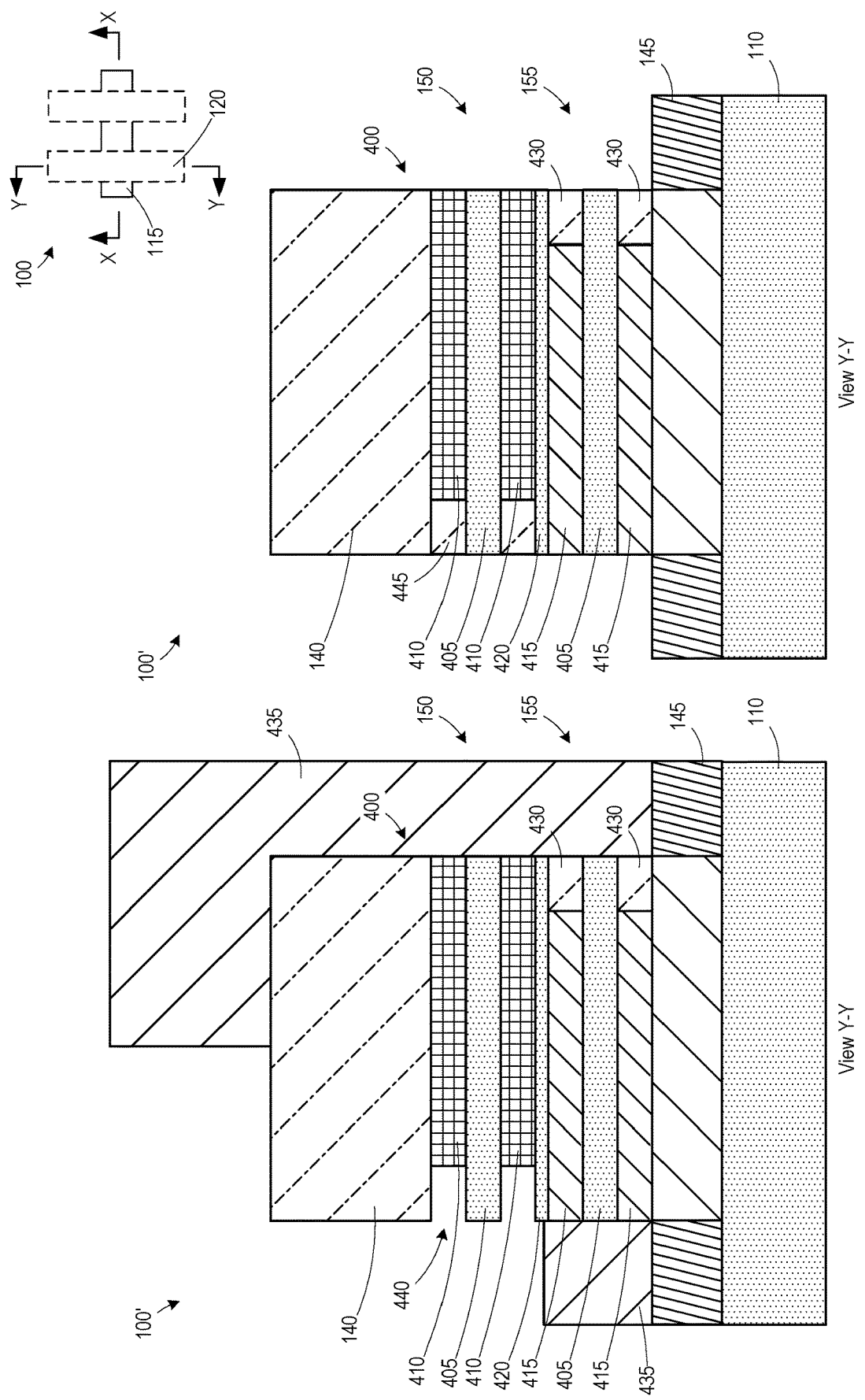

VERTICALLY STACKED COMPLEMENTARY-FET DEVICE WITH INDEPENDENT GATE CONTROL

BACKGROUND

Field of the Disclosure

Generally, the present disclosure relates to the manufacture of semiconductor devices, and, more specifically, to various novel methods of forming vertically stacked complementary-FET devices with independent gate control, and the resulting devices.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure.

One type of device that shows promise for advanced IC products of the future is generally known as a nano-sheet device. In general, a nano-sheet device has a fin-type channel structure that is comprised of a plurality of vertically spaced-apart sheets of semiconductor material. A gate structure for the device is positioned around each of these spaced-apart layers of channel semiconductor material. Such a nano-sheet device may be formed as part of a high speed logic circuit. Typically, the nano-sheet device may be operated at a relatively low voltage, e.g., 1 V or less (based on today's technology), and it is specifically designed for high-speed operation and low-power consumption (especially for IC products that are employed in mobile devices like smartphones).

One example of a complex gate-all-around technology is a complementary-FET (CFET), which is a 3D monolithic structure having NFET and PFET nanowires/nanosheets vertically stacked on top of each other. A CFET layout typically has P-type FETs on one-level and N-type FETs on an adjacent level (i.e., above or below). In such structures, the source/drain regions of the lower FET are electrically isolated from the source/drain regions of the upper FET by dielectric layers.

To balance the threshold voltages of CMOS devices, different gate materials are typically used for PMOS versus NMOS devices. The gate materials are generally formed using a replacement gate process that replaces a placeholder material with the desired gate materials. Due to the space constraints associated with nano-sheet devices, it is difficult to implement a replacement gate process to form different gate materials.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming vertically stacked complementary-FET devices with independent gate control, and the resulting devices. One illustrative method disclosed herein includes, among other things, forming a stack of semiconductor material layers above a substrate, the stack including an upper region and a lower region, forming a first spacer adjacent the lower region positioned at a first end of the stack, and forming a second spacer adjacent the upper region positioned at a second end of the stack opposite the first end. The method further includes forming a sacrificial gate structure above the stack, forming a sidewall spacer adjacent the sacrificial gate structure, selectively removing the sacrificial gate structure to define a gate cavity defined by the sidewall spacer and selectively removing a first subset of the semiconductor layers in the stack to define inner cavities between a second subset of remaining semiconductor material layers, forming a gate insulation layer in the inner cavities and the gate cavity, forming a first conductive material in the inner cavities, forming a first mask covering the second end of the stack, removing the first conductive material from the inner cavities in the upper region, wherein the first conductive material in the inner cavities in the lower region remain as a first gate electrode, removing the first mask, and forming a second conductive material different than the first conductive material in the inner cavities in the upper region to define a second gate electrode.

One illustrative device disclosed herein comprises a first transistor device of a first type, a second transistor device of a second type positioned vertically above the first transistor. wherein the first type and second type of transistors are opposite types. The device also includes a gate structure for the first transistor and the second transistor, wherein the gate structure comprises a first gate electrode for the first transistor and a second gate electrode for the second transistor and a gate stack spacer positioned vertically between the first gate electrode and the second gate electrode so as to electrically isolate the first gate electrode from the second gate electrode.

BRIEF DESCRIPTION OF THE DRAWINGS

The disclosure may be understood by reference to the following description taken in conjunction with the accompanying drawings, in which like reference numerals identify like elements, and in which:

FIGS. 2A-2D depict an alternative flow for forming upper and lower spacers; and

FIGS. 3A-3D depict an alternative flow for forming upper and lower spacers using an end spacer configuration.

Figure 1B:
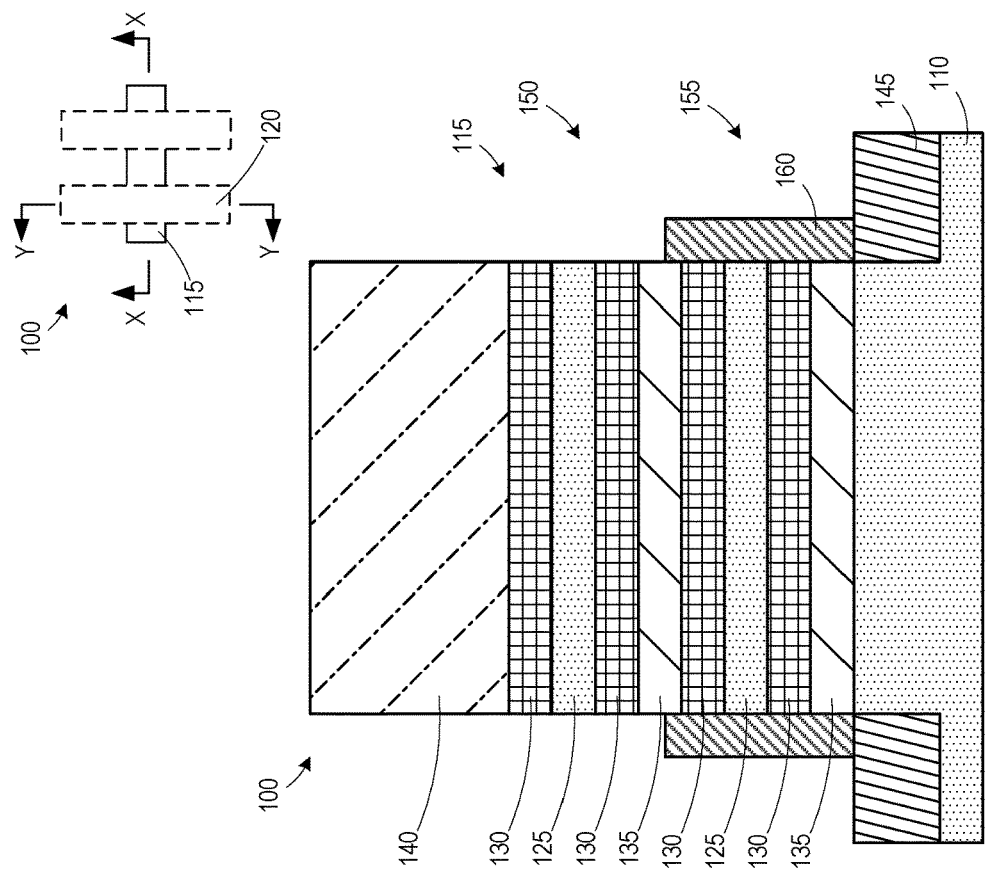
FIGS. 1A-1P depict various illustrative novel methods disclosed herein for methods of forming dual replacement gates in a complementary-FET device 100 with vertically stacked P-type and N-type FETs.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 1A:
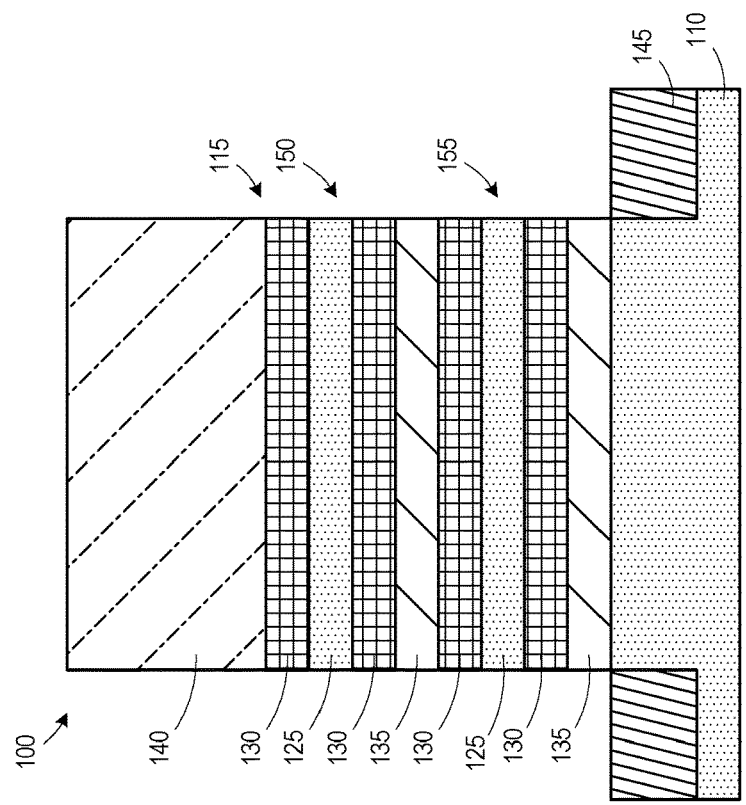
Figure 1C:
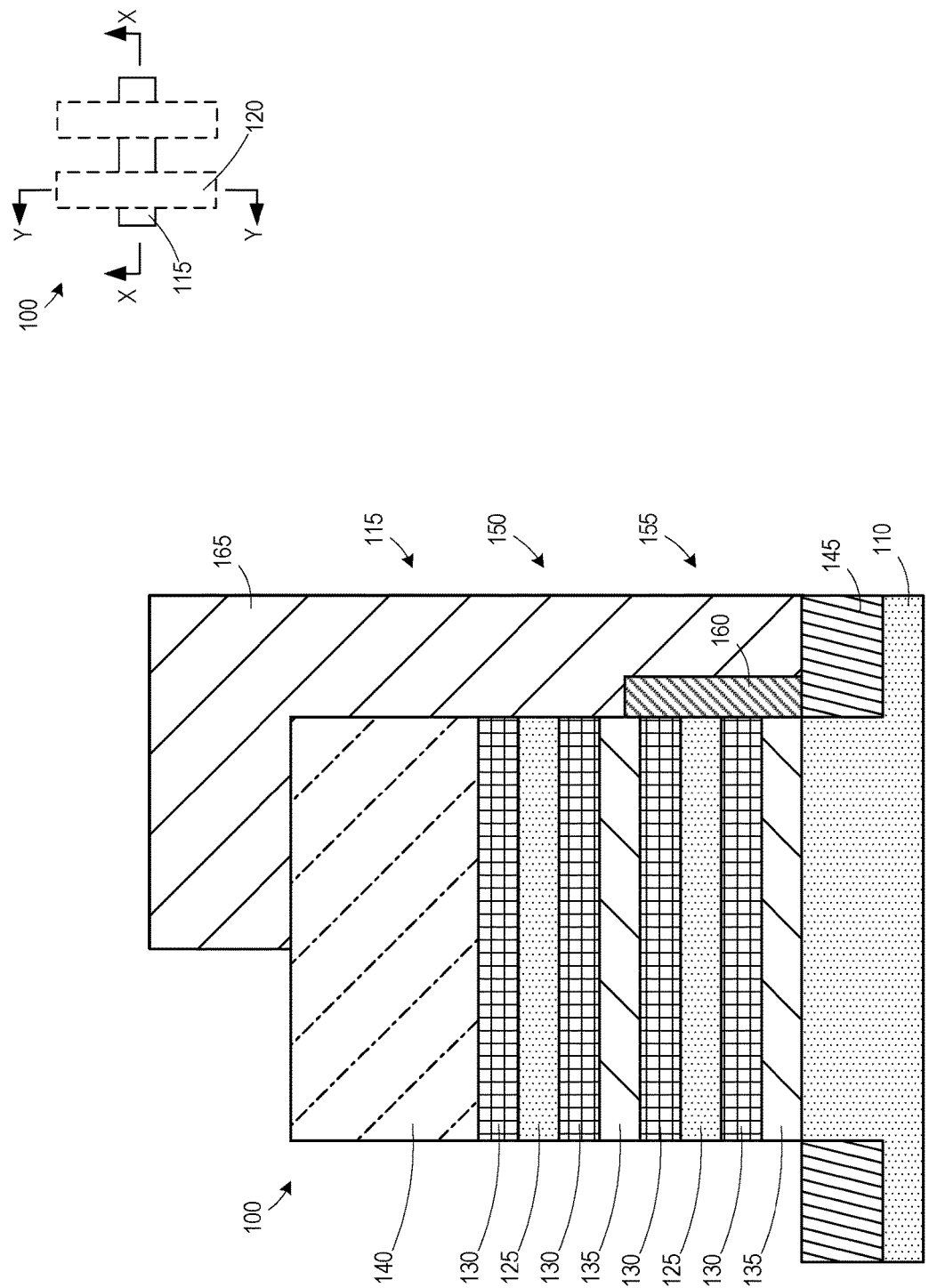
Figure 1D:
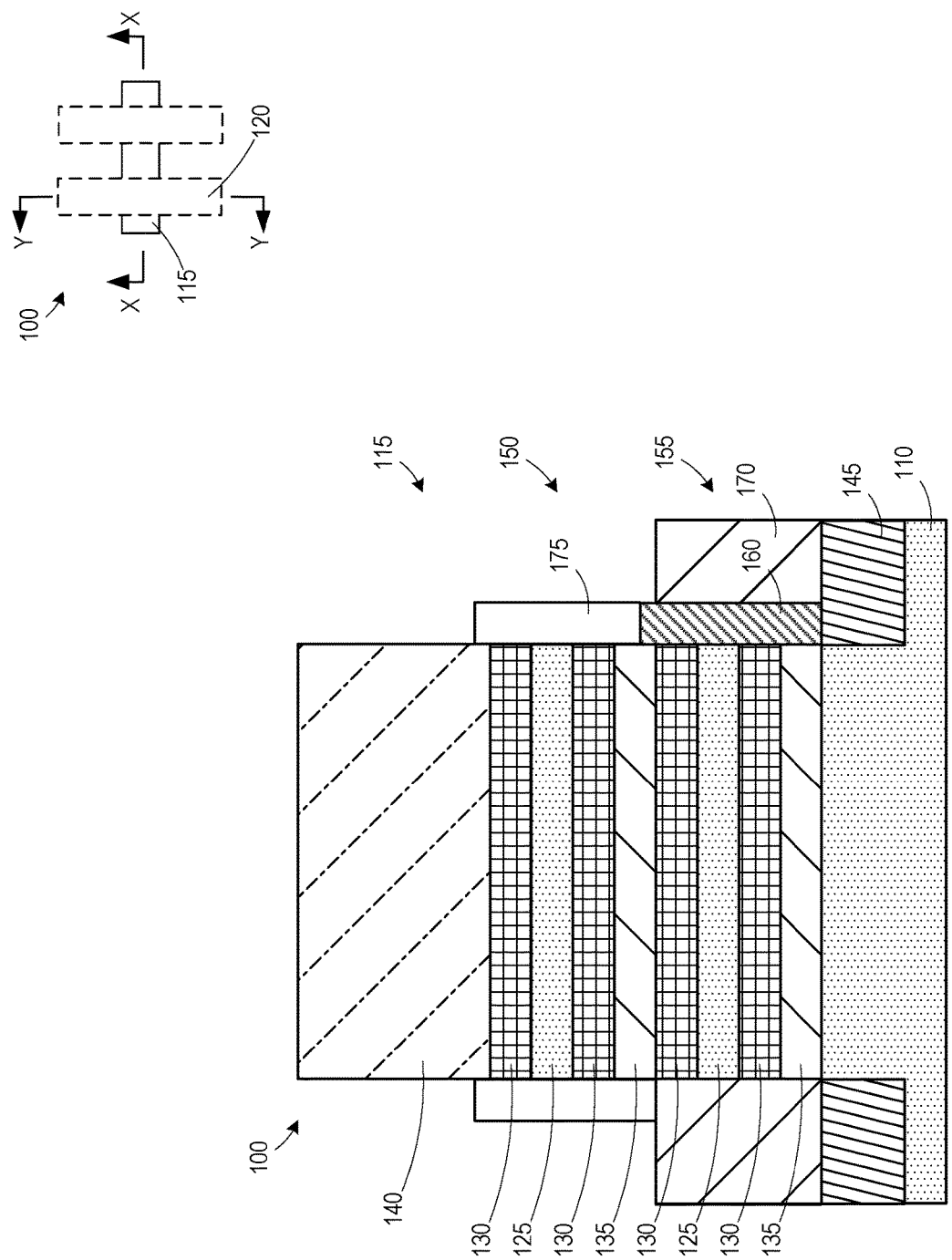
Figure 1E:
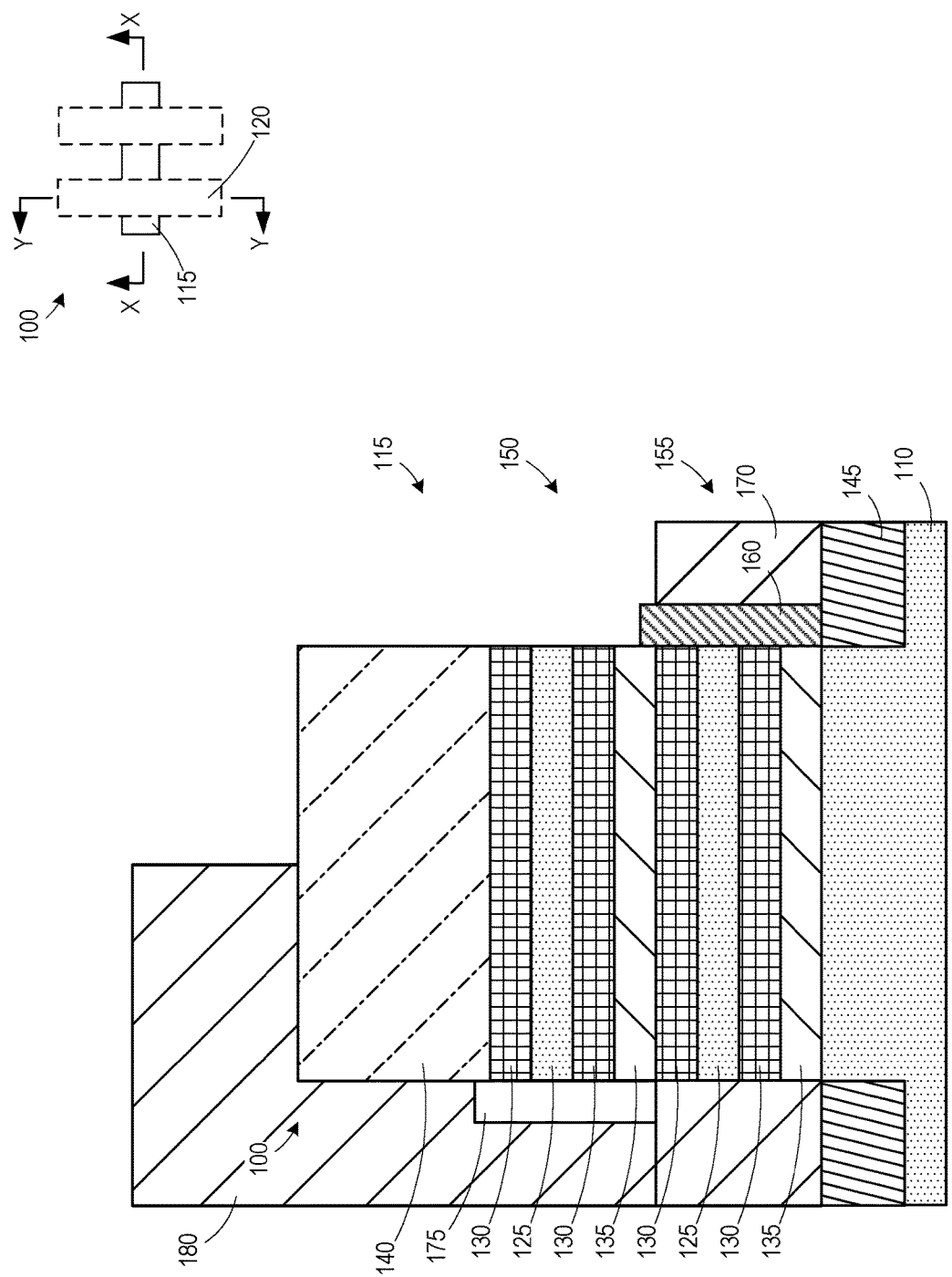
Figure 1F:
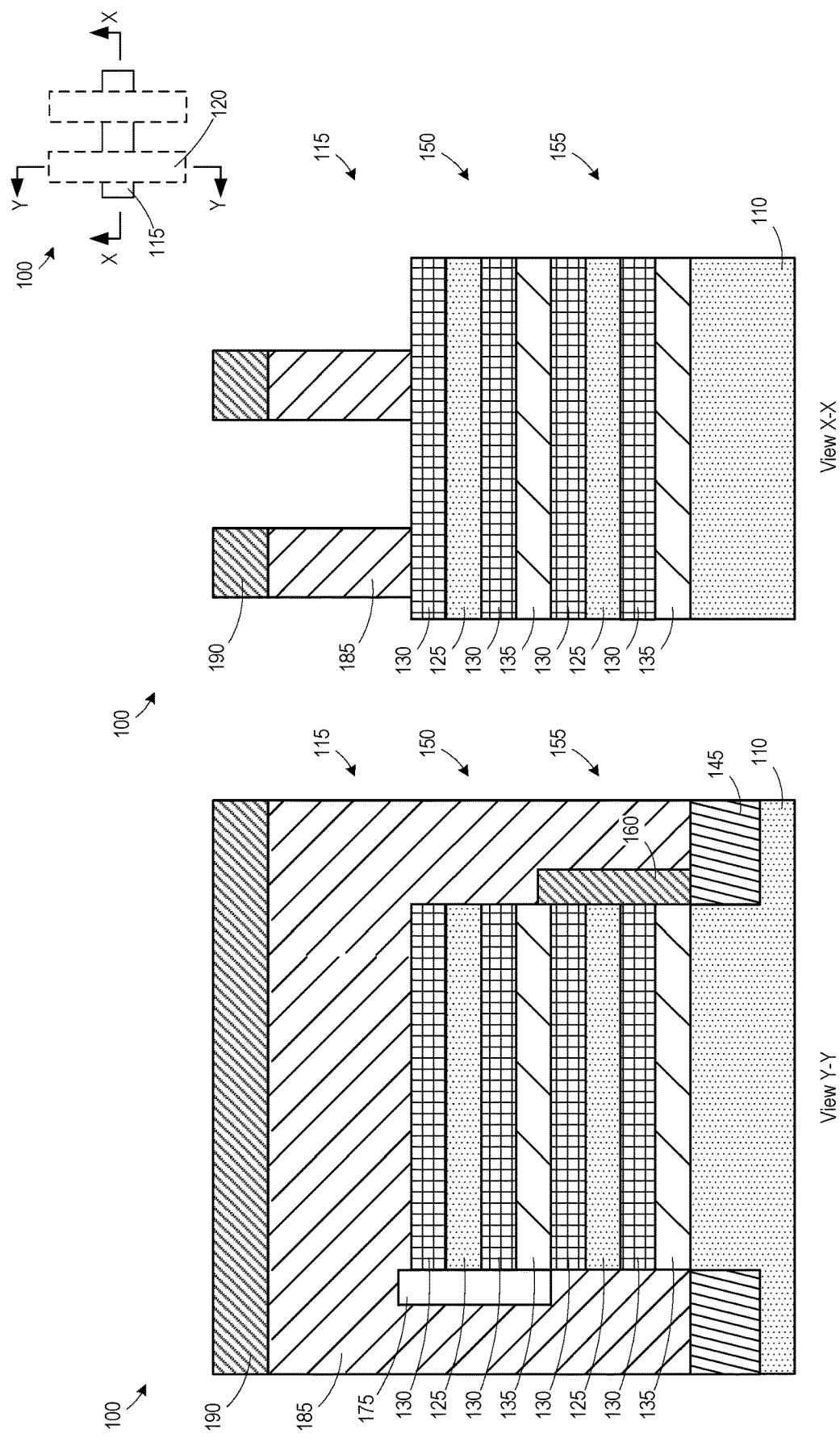
Figure 1G:
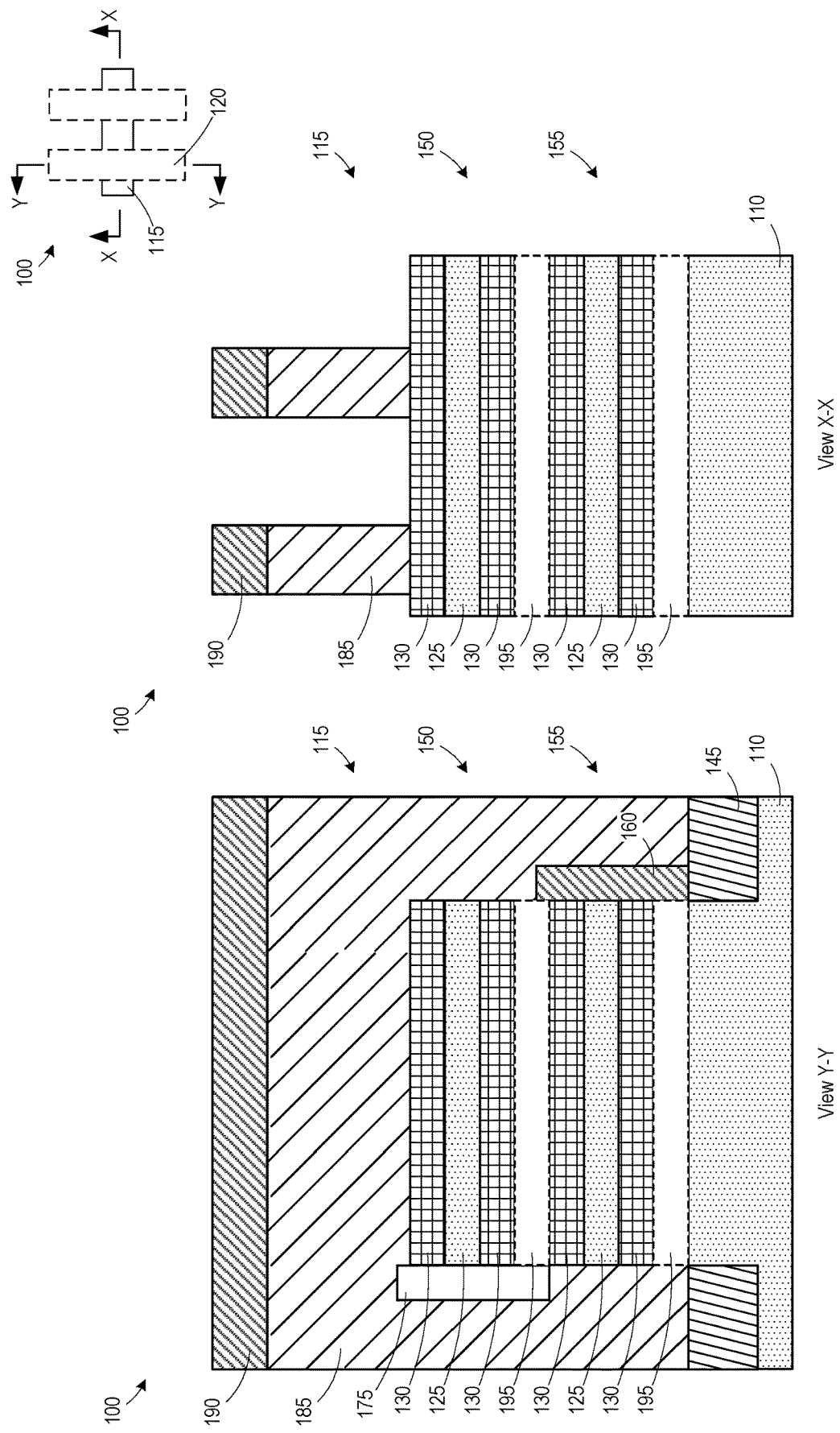
Figure 1H:
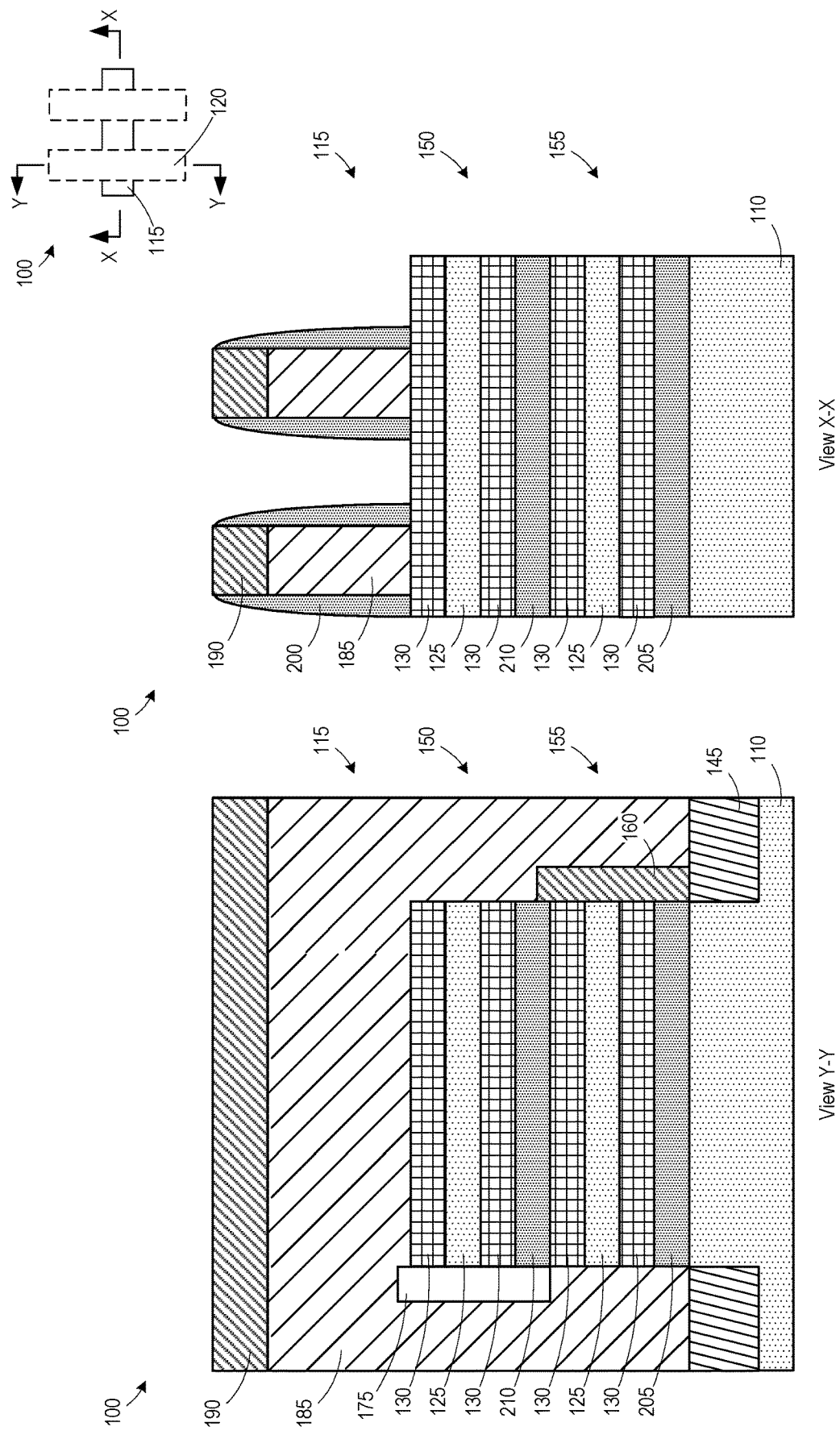
Figure 1I:
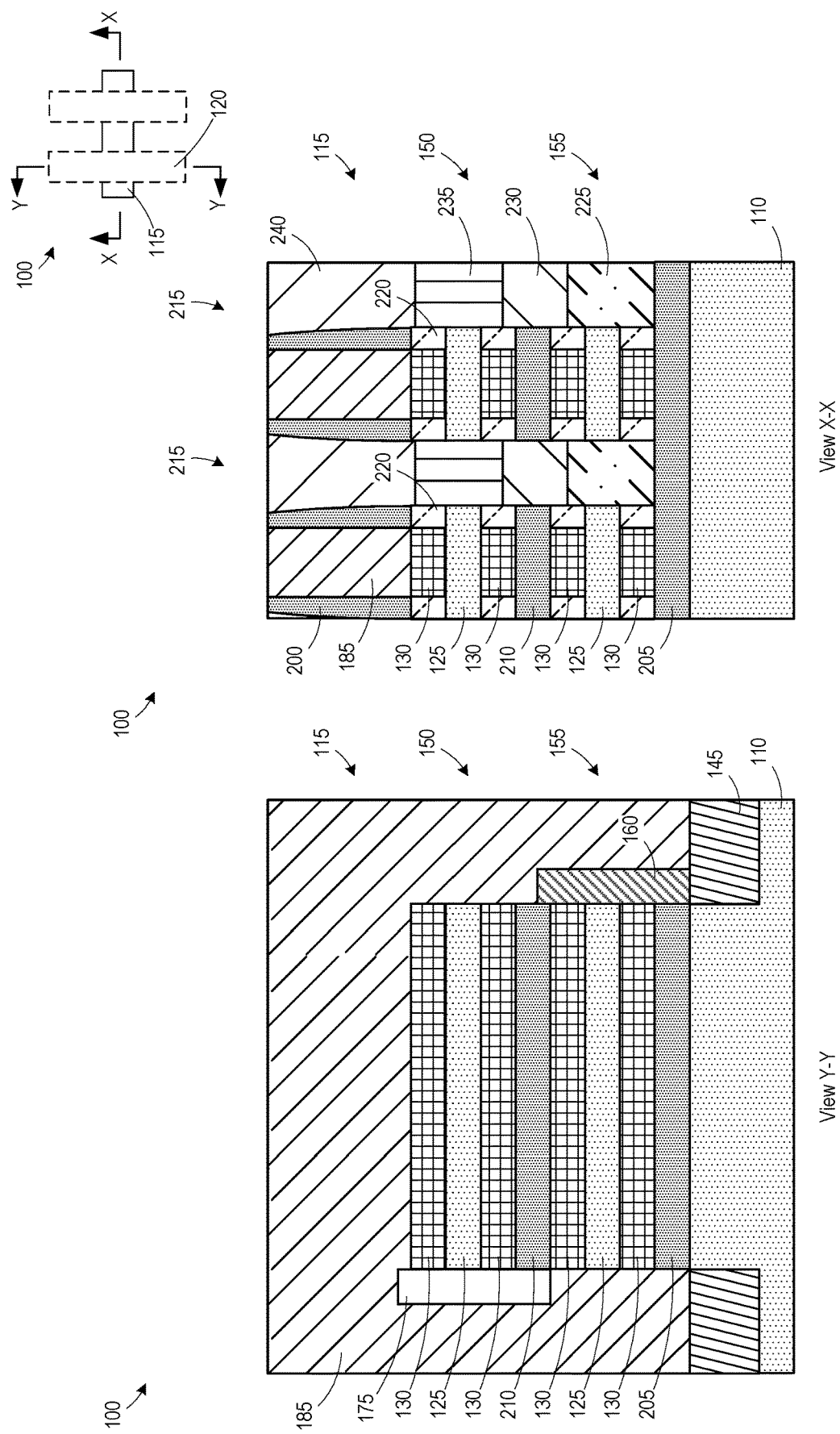
Figure 1J:
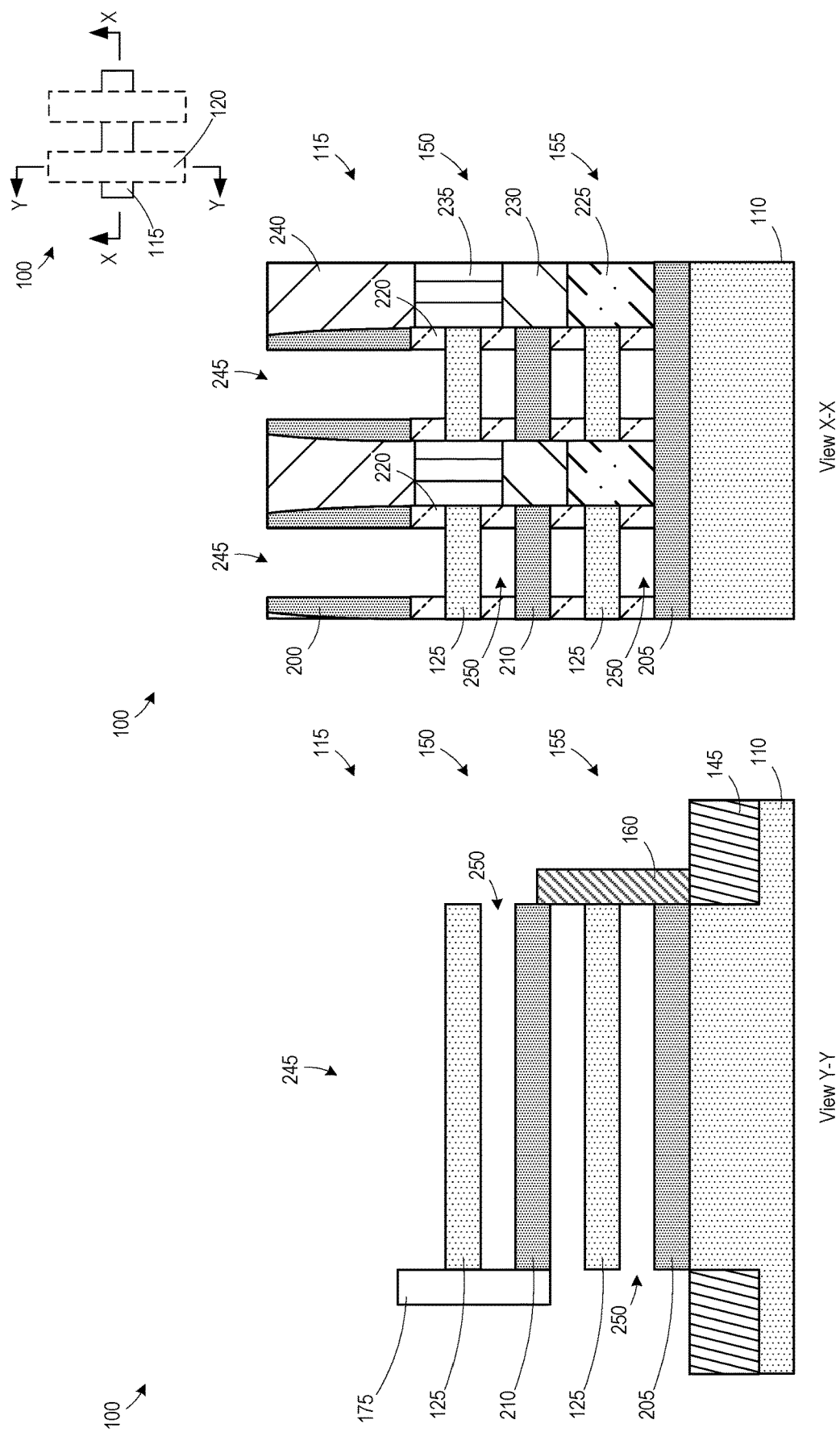
Figure 1K:
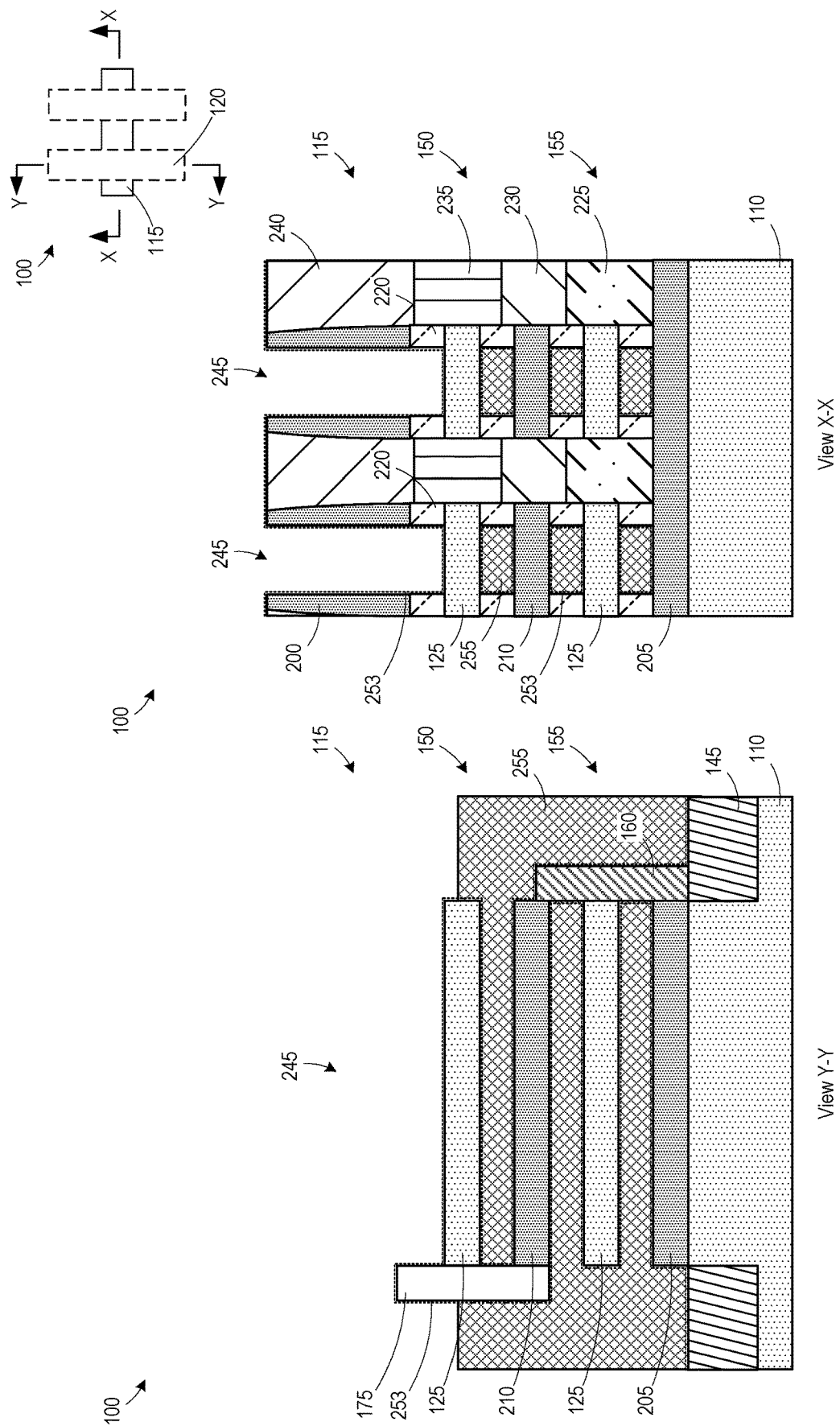
Figure 1L:
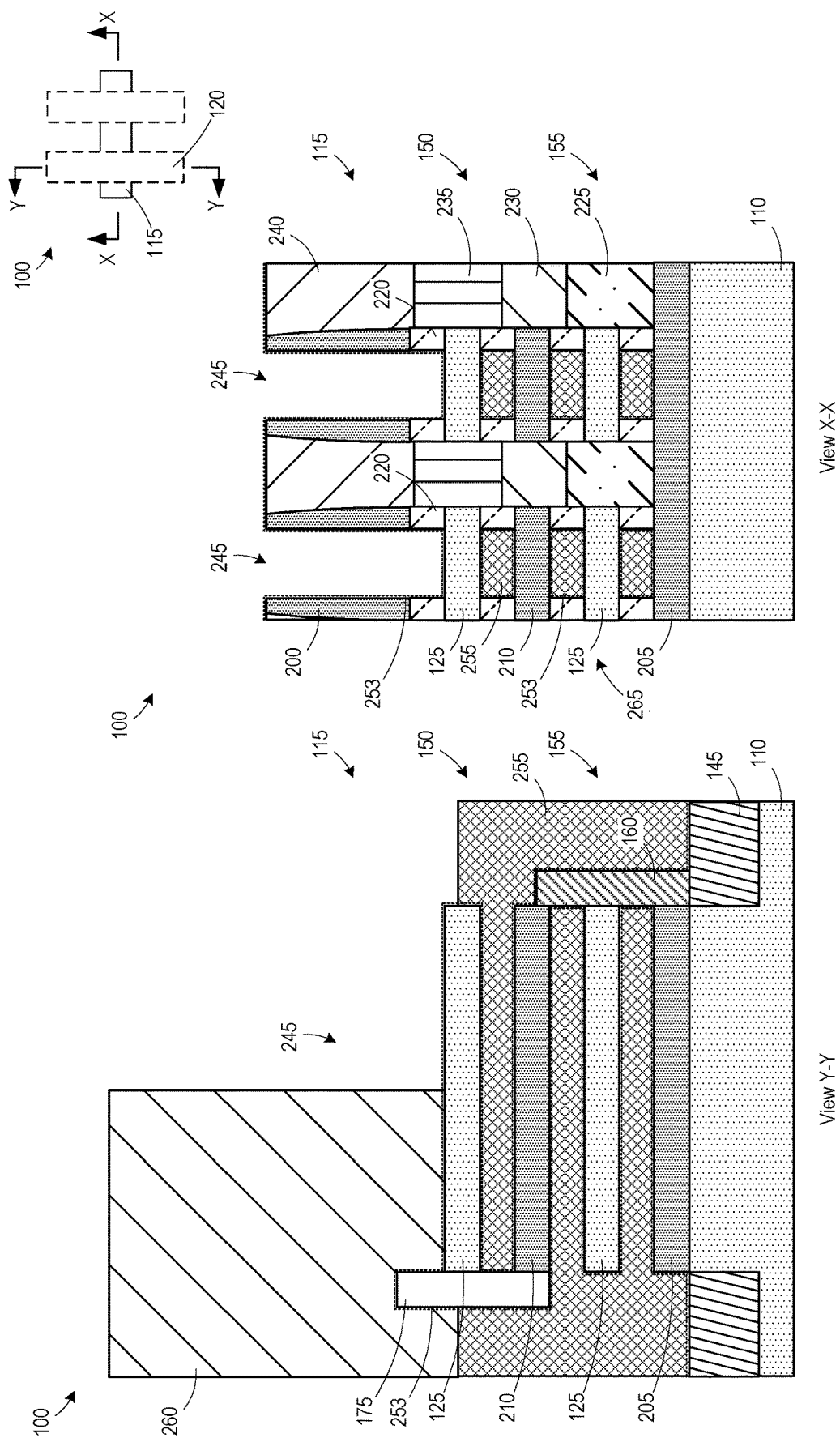
Figure 1M:
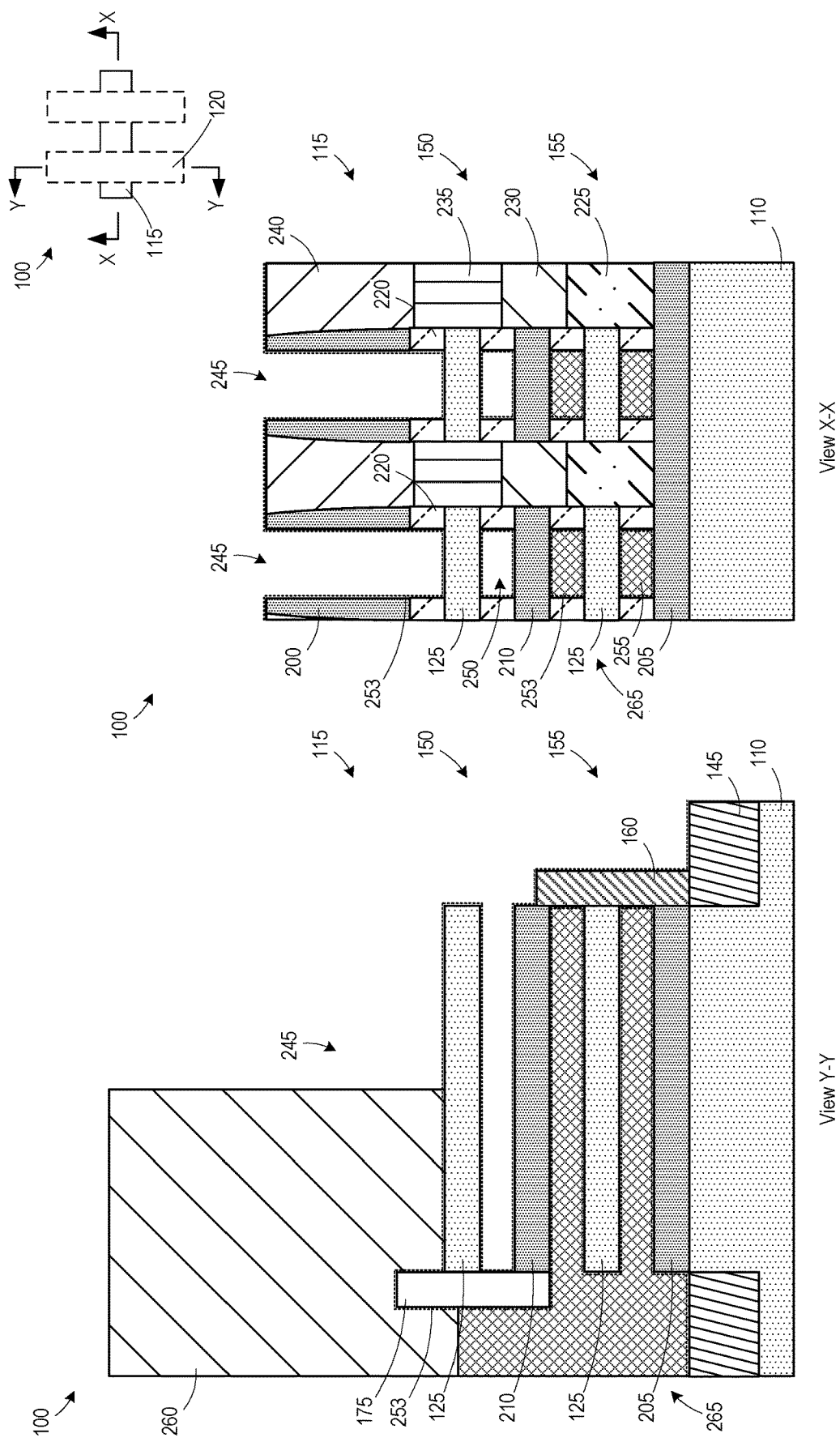
Figure 1N:
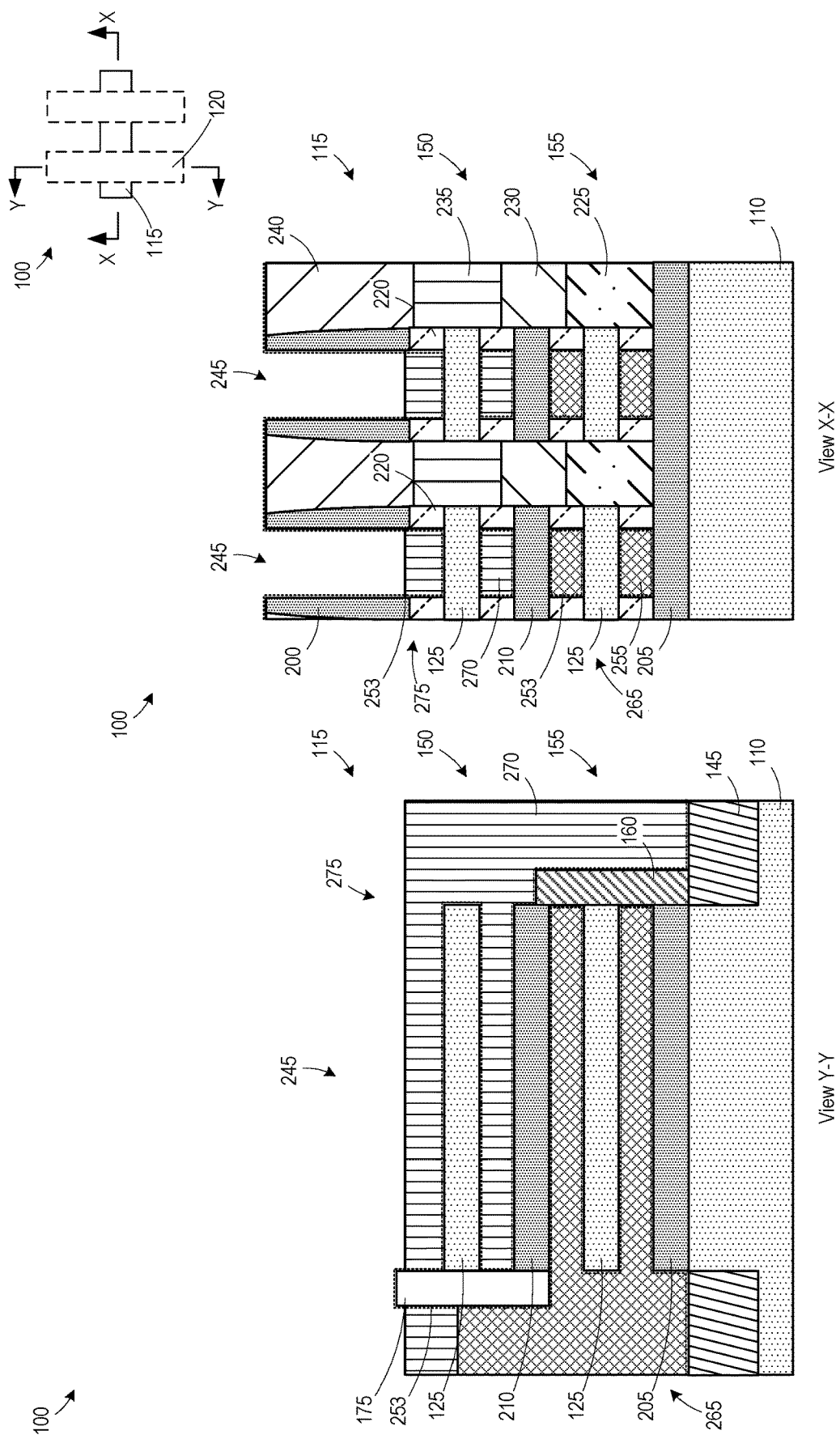
Figure 1O:
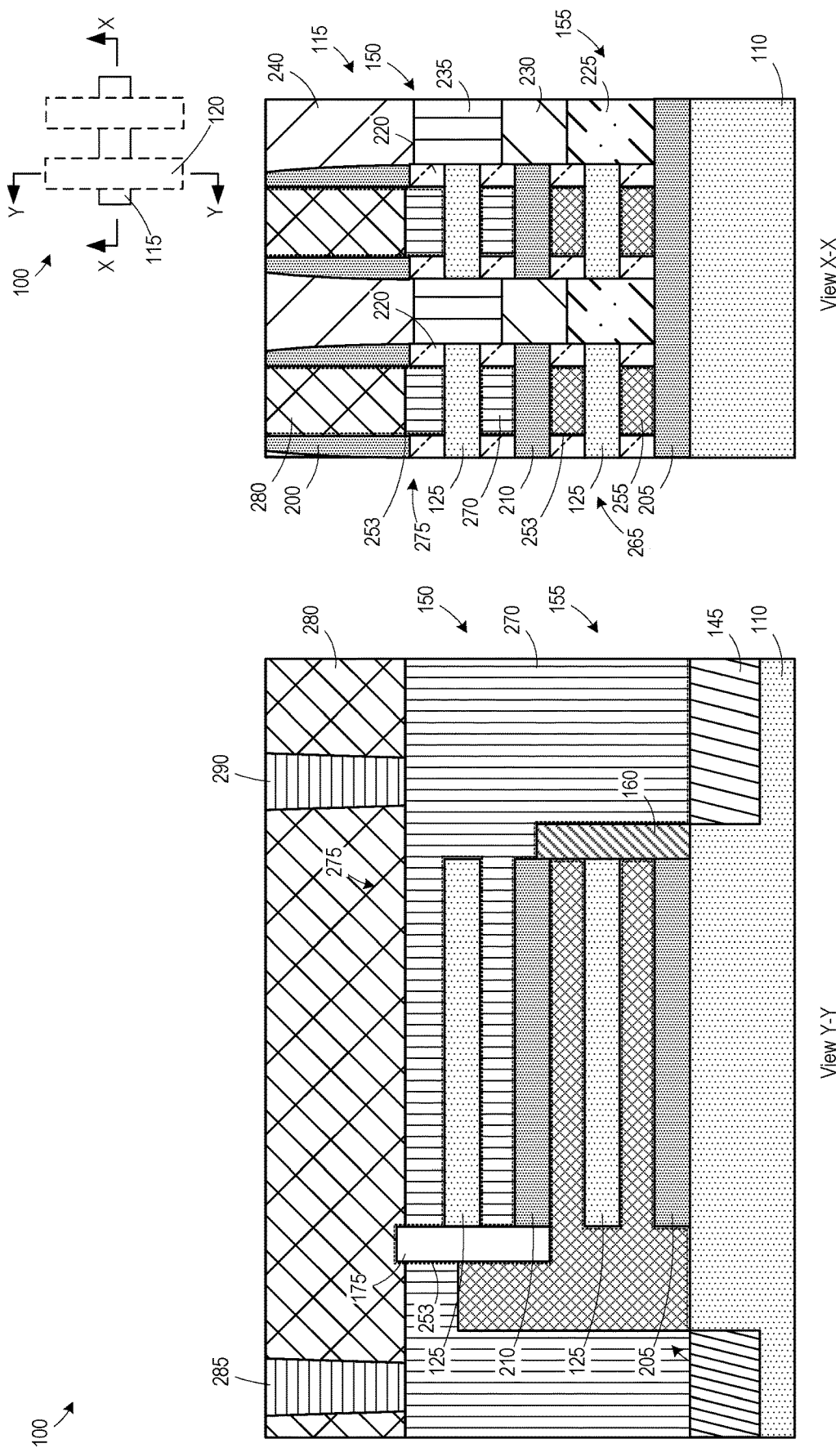
Figure 1P:
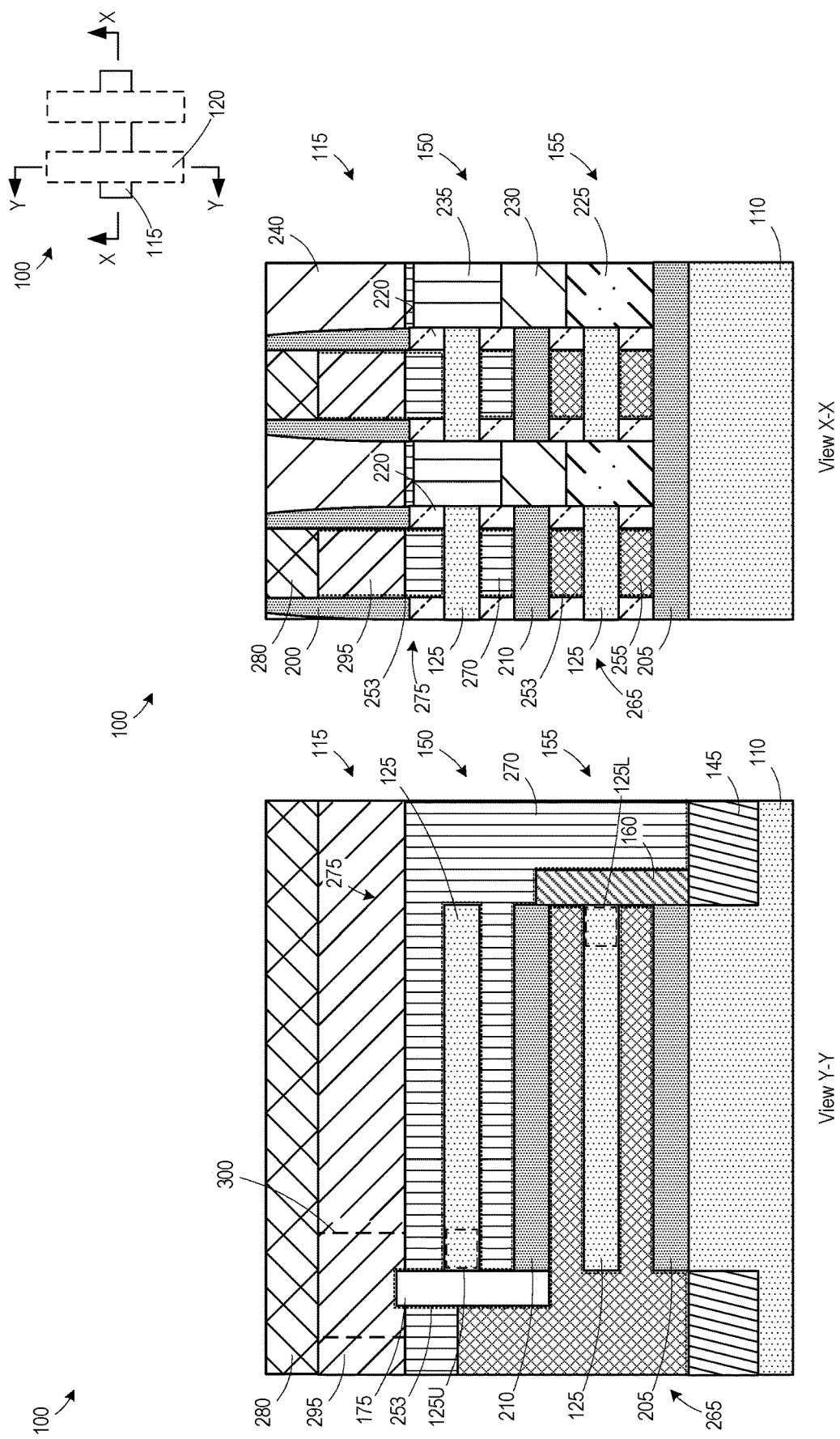

FIGS. 1A-1P depict various illustrative novel methods disclosed herein for methods of forming dual replacement gates in a complementary-FET device 100 with vertically stacked P-type and N-type FETs. In the examples depicted herein, the complementary-FET device 100 will be formed in and above a semiconductor substrate 110. The substrate 110 may have a variety of configurations, such as the depicted bulk configuration. A semiconductor-on-insulator (SOI) configuration that includes a bulk semiconductor layer, a buried insulation layer positioned on the bulk substrate 110 and one or more semiconductor material layers positioned on the buried insulation layer may also be used. The substrate 110 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

In the example depicted herein, the complementary-FET device 100 may be formed as part of a high speed logic circuit. The illustrative complementary-FET device 100 includes a nano-sheet stack 115 and gate structures 120 (depicted in dashed lines in the plan view) formed across the nano-sheet stack 115. In some embodiments, the nano-sheet stack 115 may be a fin-like structure (i.e., a stack of nano-sheets having a narrow width compared to its axial length. Each nano-sheet stack 115 includes a plurality of interleaved semiconductor material layers 125, 130, 135. The drawings contain a simplistic plan view of the product 100 indicating where various cross-sectional views are taken. An "X-X" view is taken in the gate length direction of the device 100 (perpendicular to the gate structures 120), and a "Y-Y" view is taken in a gate width direction of the device 100 (along an axial length of the gate structure 120). However, no attempt will be made to show the various steps depicted in the cross-sectional views in the drawings in the plan view of the device 100.

FIG. 1A depicts the product 100 at a point in fabrication wherein several process operations have been performed. First, a stack of the semiconductor material layers 125, 130, 135 was formed above the substrate 110. Thereafter, a hard mask layer 140 (e.g., silicon nitride) was formed above the stack. An etching process was performed using the hard mask 140 to define the nano-sheet stack 115. An isolation structure 145 (e.g., silicon dioxide) was formed adjacent the nano-sheet stack 115. In general, the semiconductor material layers 125, 130, 135 are made of different semiconductor materials such that they may be selectively removed (by etching) relative to one another. In the examples depicted herein, the semiconductor material layers 125, 130 are sacrificial in nature while the semiconductor material layers 125 will become the channel region material for the complementary-FET device 100. In one illustrative embodiment, the semiconductor material layer 125 may comprise substantially pure silicon, the semiconductor material layer 130 may comprise silicon-germanium ($Si_xGe_{(1-x)}$ where x ranges from 0.65 to 0.85), and the semiconductor material layer 135 may comprise silicon-germanium ($Si_yGe_{(1-y)}$ where y ranges from 0.25 to 0.5). The thicknesses of the semiconductor material layers 125, 130, 135 may vary depending upon the particular application and they need not have the same thicknesses.

The middle semiconductor material layer 135 divides the complementary-FET device 100 into an upper portion 150 and a lower portion 155. In some embodiments, the upper portion 150 may be associated with an N-type transistor, and the lower portion 155 may be associated with a P-type transistor (i.e., of course, these could be reversed). The number of semiconductor material layers 125, 130 that are formed for the upper and lower portions may vary depending upon the particular application. In the illustrative example depicted herein, there is one semiconductor material layer 125 for the channel region in each portion 150, 155. The effective size of the complementary-FET device 100 may be modulated by providing additional semiconductor material layers 125 separated by additional semiconductor material layers 130 in each portion 150, 155.

FIG. 1B illustrates the complementary-FET device 100 after several processes were performed to define a lower spacer 160 on the nano-sheet stack 115. A conformal layer of spacer material was formed above the nano-sheet stack 115, and an anisotropic etch process was performed to remove horizontal portions of the layer of spacer material and to reduce the height of the vertical portions of the spacer layer to define the lower spacer 160. The height of the lower spacer 160 is controlled such that the upper surface partially overlaps the middle semiconductor material 135.

FIG. 1C illustrates the complementary-FET device 100 after a mask layer 165 (e.g., organic patterning layer (OPL)) was formed above the nano-sheet stack 115 and patterned to cover the right portion of the nano-sheet stack 115 and expose the left portion of the nano-sheet stack 115, thereby exposing a portion of the spacer 160. An etch process was performed to remove the exposed portion of the spacer 160.

FIG. 1D illustrates the complementary-FET device 100 after several processes were performed. The mask layer 165 was stripped. A mask layer 170 (e.g., OPL) was formed above the nano-sheet stack 115 and recessed to cover a bottom portion of the nano-sheet stack 115. An upper spacer 175 was formed adjacent the nano-sheet stack 115 above the mask layer 170 (i.e., using a process similar to that described above for the lower spacer 160). The positioning of the upper spacer 175 is controlled based on the thickness of the mask layer 170 so that the lower surface of the upper spacer 175 covers the semiconductor material layers 125, 130 in the upper region 150 without covering the semiconductor material layers 125, 130 in the lower region 155. The height of the upper spacer 175 is controlled such that the lower surface partially overlaps the middle semiconductor material 135.

FIG. 1E illustrates the complementary-FET device 100 after a mask layer 180 (e.g., organic patterning layer (OPL)) was formed above the nano-sheet stack 115 and the previously-formed mask layer 170 and patterned to cover the left portion of the nano-sheet stack 115 and expose the right portion of the nano-sheet stack 115. An etch process was performed to remove the exposed portion of the upper spacer 175. The materials of the lower spacer 160 and the upper spacer 175 may be selected such that they may be etched selectively with respect to one another. For example, one spacer 160, 175 may be formed from a nitride-based low-k material, such as SiBCN, and the other spacer 160, 175 may be formed from an oxide based low-k material, such as SiOC.

FIG. 1F illustrates the complementary-FET device 100 along views Y-Y and X-X after several processes were performed. The mask layers 170, 180 were stripped. The hard mask layer 140 was removed. Sacrificial gate structures 185 were formed thereabove, contacting top and sidewall surfaces of the nano-sheet stack 115. The sacrificial gate structures 185 are sacrificial in nature in that they are replaced at a later point in the process flow with other materials to form functional gate structures, as described below. The sacrificial gate structures 185 may include one or more layers of material, such as a sacrificial gate insulation layer (e.g., silicon dioxide), and a sacrificial gate material (e.g., amorphous silicon)—not separately shown. Cap layers 190 (e.g., silicon nitride or a stack including silicon nitride and silicon dioxide) remaining from patterned hard mask layers employed to pattern the sacrificial gate structures 185 are positioned above the gate structures 185.

FIG. 1G illustrates the complementary-FET device 100 after a selective etch process was performed to remove the semiconductor material layers 135 and define stack cavities 195.

FIG. 1H illustrates the complementary-FET device 100 after sidewall spacers 200 were formed adjacent the sacrificial gate structures 185 (i.e., using a process similar to that described above for the lower spacer 160). The material of the sidewall spacer 200 also fills the stack cavities 195 to define a bottom spacer 205 isolating the nano-sheet stack 115 from the substrate 110 and a gate stack spacer 210 isolating the upper portion 150 of the nano-sheet stack 115 from the lower portion of the nano-sheet stack 115.

FIG. 1I illustrates the complementary-FET device 100 after several processes were performed. An etch process was performed using the sacrificial gate structures 185 and the sidewall spacers 200 as an etch mask to define source/drain cavities 215. An isotropic etch process was performed to recess the semiconductor material layers 130 to define end cavities on ends thereof. A conformal deposition process, such as an ALD process, was performed to form a layer of spacer material above the nano-sheet stack 115 and the sacrificial gate structures 185, and the spacer layer was anisotropically etched to define inner spacers 220 in the end cavities. Several deposition processes were performed to define a lower source/drain region 225 (e.g., P-type epi), a source/drain epitaxy spacer 230 (e.g., dielectric material), and an upper source/drain region 235 (e.g., N-type epi) in the source/drain cavities 215. A dielectric layer 240 was deposited and planarized to expose the sacrificial gate structures 185 (e.g., by removing the cap layer 190).

FIG. 1J illustrates the complementary-FET device 100 after several etch processes were performed to remove the sacrificial gate structures 185 and the semiconductor material layers 130 to define gate cavities 245 and inner cavities 250 (i.e., portions of the gate cavity 250 surrounding the semiconductor material layers 125).

FIG. 1K illustrates the complementary-FET device 100 after several processes were performed. A first deposition process was performed to form a gate insulation layer 253 (e.g., high-k dielectric, such as hafnium oxide—shown as a dashed line) in the gate cavities 245, 250. One or more deposition processes were performed to form a first conductive material 255 in the cavities 245, 250 above the gate insulation layer 253. An etch back process was performed to remove the first conductive material 255 from the upper portion of the gate cavities 245, while leaving the inner cavities 250 filled. The first conductive material 255 may be a work function material (WFM) layer or stack of layers. In some embodiments, the WFM material may be suited for a P-type device. An example PFET WFM material is TiN. The first conductive material 255 may be deposited to completely fill the inner cavities 250 and the gate cavities 245 and then etched back to remove the portion of the first conductive material 255 in the upper portion of the gate cavities 245. In another embodiment, the first conductive material 255 may be deposited as a conformal layer that fills the inner cavities 250 and lines the upper portions of the gate cavities 245. The conformal layer may be chamfered by forming an OPL layer that covers the sides of the first conductive material 255 in the inner cavities 250 and performing an etch process that removes the portions of the first conductive material 255 that line the upper portions of the gate cavities 245.

FIG. 1L illustrates the complementary-FET device 100 after a mask layer 260 (e.g., OPL) was formed above the nano-sheet stack 115 and patterned to cover the left portion of the first conductive material 255 and expose the right portion. The combination of the mask layer 260, the upper spacer 175, the lower spacer 160, and the gate stack spacer 210 protects the first conductive material 255 in the lower region 155 and exposes the first conductive material 255 in the upper region 150.

FIG. 1M illustrates the complementary-FET device 100 after an etch process was performed to remove the exposed portions of the first conductive material 255, reopening the cavities 250 in the upper region 150. The remaining portions of the first conductive material 255 define a first gate electrode 265 (e.g., PFET portion) in the lower region 155.

FIG. 1N illustrates the complementary-FET device 100 after a strip process was performed to remove the mask layer 260 and one or more deposition processes were performed to form a second conductive material 270 in the cavities 245, 250 above the gate insulation layer 253. An etch back process was performed to remove the second conductive material 270 from the gate cavities 245, while leaving the inner cavities 250 in the upper region 150 filled. The second conductive material 270 may be a WFM layer or stack of layers suited for an N-type device. An example NFET WFM material is a stack including TiN/TiC/TiN. Of course, other WFM materials may be used for the first and second conductive materials 255, 270. The second conductive material 270 defines a second gate electrode 275 (e.g., NFET portion) in the upper region 150.

FIG. 1O illustrates the complementary-FET device 100 after several processes were performed. A deposition process, followed by a planarization process, was performed to form a dielectric cap layer 280 in the gate cavities 245. Gate contacts 285, 290 are formed extending through the cap layer 280 (i.e., and any other dielectric layer formed above the cap layer 280) to contact the first gate electrode 265 and the second gate electrode 275, respectively. In this configuration, the first gate electrode 265 and the second gate electrode 275 are independent.

FIG. 1P illustrates the complementary-FET device 100 after several processes were performed in an alternative process flow. Starting with the complementary-FET device 100 in FIG. 1N, one or more deposition processes were performed to form a third conductive material 295 (e.g., tungsten) in the gate cavities 245. An etch back process was performed to recess the third conductive material 295. A deposition process, followed by a planarization process, was performed to form the cap layer 280 in the gate cavities 2450. In this configuration, the first gate electrode 265 and the second gate electrode 275 represent a shared gate electrode. A single gate contact (not shown) may be formed to contact the shared gate electrode.

The third conductive material 295 may also be employed with independent gate electrodes, by performing a patterned etch to cut the third conductive material 295 in the region indicated by the dashed box 300 and filling in the resulting recess with the cap layer 280.

In some embodiments, the spacers 160, 175 may be doped. For example, the spacer 160 associated with the N-type transistor in the lower portion 155 may be doped with a P-type dopant (e.g., B), and the spacer 175 associated with the N-type transistor in the upper portion 150 may be doped with an N-type dopant (e.g., P, As). At any time in the process flow, an annealing process may be performed to diffuse the dopants from the spacers 160, 175 into the semiconductor material layers 125 to define counter-doped regions 125U, 125L. If the anneal is performed prior to the removal of the semiconductor material layers 135 in FIG. 1G or the removal of the semiconductor material layers 130 in FIG. 1J, the dopant would also diffuse into these layers 130, 135. However, the dopant does not affect the etch selectivity of the layers 130, 135.

FIGS. 2A-2D illustrate an alternative process flow for forming the lower and upper spacers 160, 175. Starting with the complementary-FET device 100 illustrated in FIG. 1A, a deposition process was performed to form a conformal spacer layer 305 above the nano-sheet stack 115. A mask layer 310 (e.g., OPL) was formed above the nano-sheet stack 115 and the spacer layer 305 and patterned to cover the right portion of the nano-sheet stack 115 and expose the left portion of the nano-sheet stack 115. An etch process was performed to remove the exposed portion of the spacer layer 305.

FIG. 2B illustrates the complementary-FET device 100 after a strip process was performed to remove the mask layer 310, and a second mask layer 315 was formed covering the lower region 155. An etch process was performed to remove the exposed portion of the spacer layer 305, thereby defining the lower spacer 160.

Figures 2C, 2D:
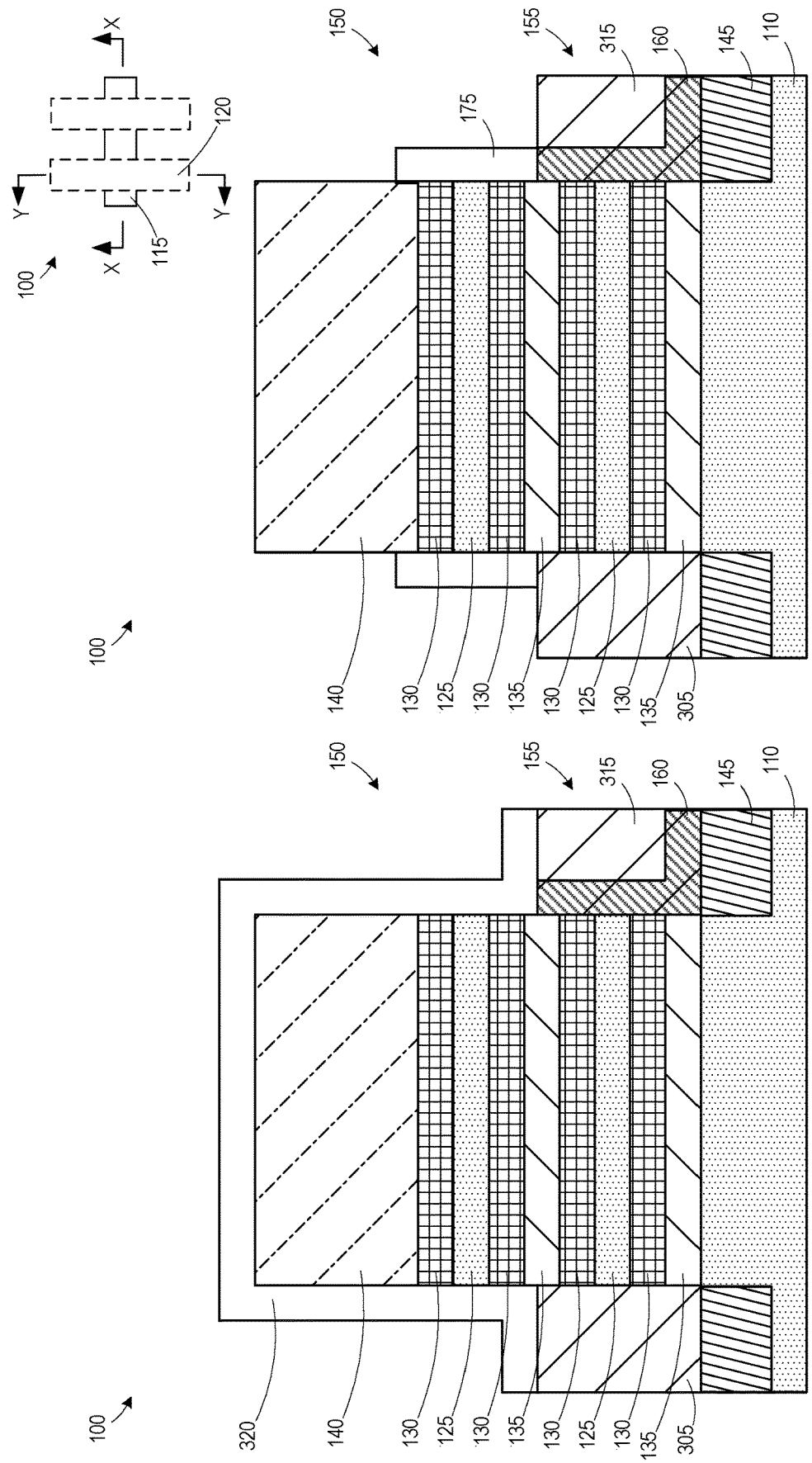

FIG. 2C illustrates the complementary-FET device 100 after a deposition process was performed to form a second conformal spacer layer 320 above the mask layer 315 and the nano-sheet stack 115.

FIG. 2D illustrates the complementary-FET device 100 after an anisotropic etch process was performed to form upper spacers 175 from the spacer layer 320. Processing may then continue as described starting with FIG. 1E. In this process flow, the spacers 160, 175 may be made of the same material.

FIGS. 3A-3D illustrate an alternative process flow forming a complementary-FET device 100' without forming the lower and upper spacers 160, 175. In some embodiments, the configuration of the nano-sheet stack 400 may be different than that of the nano-sheet stack 115 illustrated in FIG. 1A. The isolation structure 145 extends beneath the entire nano-sheet stack 400 (e.g., an SOI substrate configuration). In the examples depicted herein, the nano-sheet stack 400 includes semiconductor material layers 405, 410, 415, 420. The semiconductor material layers 410, 415 are sacrificial in nature while the semiconductor material layers 405 will become the channel region material for the complementary-FET device 100'. In one illustrative embodiment, the semiconductor material layer 405 may comprise substantially pure silicon, the semiconductor material layer 410 may comprise silicon-germanium ($Si_xGe_{(1-x)}$ where x ranges from 0.65 to 0.85), and the semiconductor material 415 may comprise silicon-germanium ($Si_yGe_{(1-y)}$ where y ranges from 0.25 to 0.5). The semiconductor material layer 420 separating the upper and lower regions 150, 155 may comprise substantially pure silicon, and may have a reduced thickness compared to the semiconductor material layers 405. The thicknesses of the semiconductor material layers 405, 410, 415, 420 may vary depending upon the particular application and they need not have the same thicknesses.

Figure 3B:
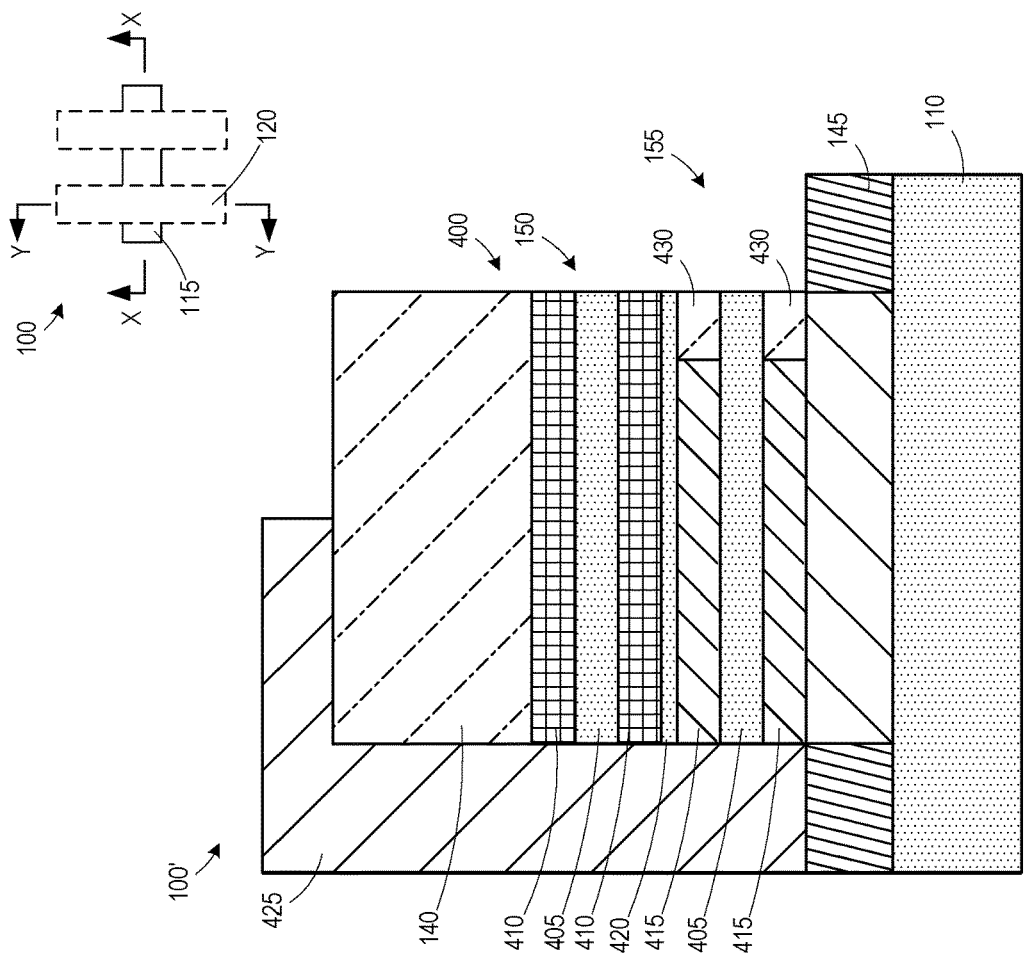
Figure 3A:
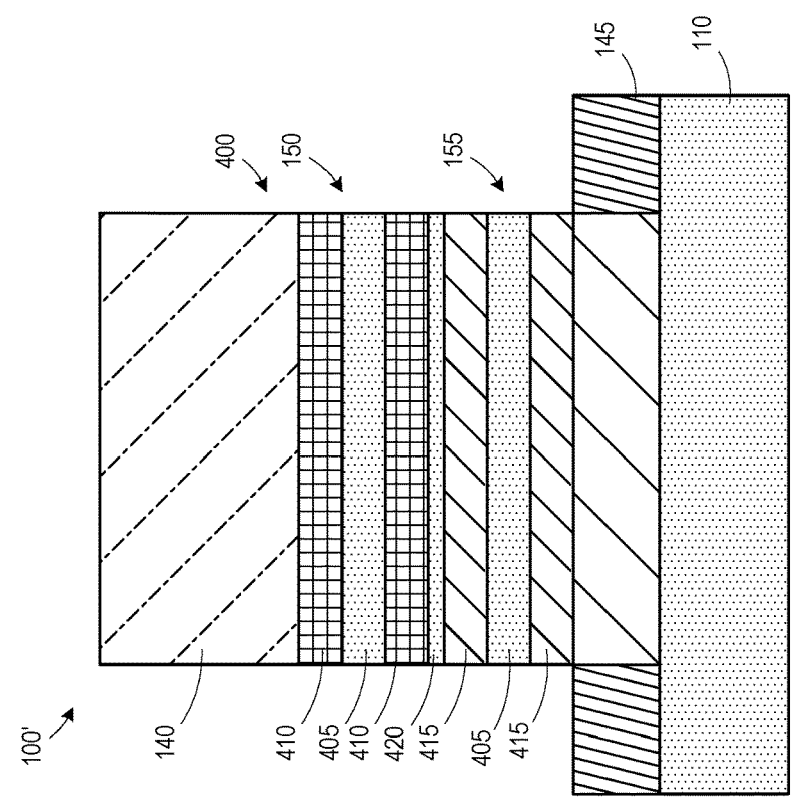

FIG. 3B illustrates the complementary-FET device 100' after several processes were performed. A mask layer 425 was formed above the left side of the nano-sheet stack 400. An isotropic etch process was performed to recess the semiconductor material layers 415 to define end cavities on ends thereof. A conformal deposition process, such as an ALD process, was performed to form a layer of spacer material above the nano-sheet stack 400, and the spacer layer was anisotropically etched to define end spacers 430 in the end cavities.

FIG. 3C illustrates the complementary-FET device 100' after several processes were performed. A mask layer 435 was formed above the right side of the nano-sheet stack 400 and covering the lower region 155 of the left side of the nano-sheet stack 400. An isotropic etch process was performed to recess the semiconductor material layers 410 to define end cavities 440 on ends thereof.

FIG. 3D illustrates the complementary-FET device 100' after several processes were performed. A strip process was performed to remove the mask layer 435. A conformal deposition process, such as an ALD process, was performed to form a layer of spacer material above the nano-sheet stack 400, and the spacer layer was anisotropically etched to define end spacers 445 in the end cavities 440.

The end spacers 430 define the lower spacer 160, and the end spacers 445 define the upper spacer 175. Processing may continue as described in FIG. 1E and the subsequent figures. In an embodiment where the semiconductor material layer 420 separating the upper and lower regions 150, 155 comprises substantially pure silicon, end portions of the semiconductor material layer 420 may be counter-doped to avoid the formation of a parasitic channel.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

The invention claimed is:

1. A device, comprising:
a first transistor device of a first type;
a second transistor device of a second type positioned vertically above the first transistor device, wherein the first type and second type of transistors are opposite types;
a gate structure for the first transistor and the second transistor, wherein the gate structure comprises a first gate electrode for the first transistor and a second gate electrode for the second transistor;
a gate stack spacer positioned vertically between the first gate electrode and the second gate electrode so as to electrically isolate the first gate electrode from the second gate electrode;
a first channel semiconductor material for the first transistor device, wherein the first gate electrode is positioned around at least portions of the first channel semiconductor material; and
a second channel semiconductor material for the second transistor device, wherein the second gate electrode is positioned around at least portions of the second channel semiconductor material.

2. The device of claim 1, wherein the first transistor is a P-type transistor and the second transistor is an N-type transistor.

3. The device of claim 1, wherein the first gate electrode comprises a first conductive material and the second gate electrode comprises a second conductive material, wherein the first conductive material is different from the second conductive material.

4. The device of claim 3, wherein the first conductive material comprises TiN and the second conductive material comprises a plurality of layers of conductive material.

5. The device of claim 4, wherein the plurality of layers of conductive material comprise TiN, TiC and TiN.

6. The device of claim 3, wherein the first conductive material comprises a first work-function material and the second conductive material comprises a second work-function material.

7. The device of claim 1, wherein the gate structure further comprises a third conductive material that is conductively coupled to the first gate electrode and to the second gate electrode.

8. The device of claim 7, wherein the third conductive material comprises tungsten.

9. The device of claim 1, wherein the gate structure further comprises a third conductive material, the third conductive material comprising first and second portions that are electrically isolated from one another, wherein the first portion of the third conductive material is conductively coupled to the first gate electrode and the second portion of the third conductive material is conductively coupled to the second gate electrode.

10. The device of claim 1, wherein the first channel semiconductor material and the second channel semiconductor material comprise a same semiconductor material.

11. A device, comprising:
a first transistor device of a first type;
a second transistor device of a second type positioned vertically above the first transistor device, wherein the first type and second type of transistors are opposite types;
a first channel semiconductor material for the first transistor device
a second channel semiconductor material for the second transistor device, wherein the first channel semiconductor material and the second channel semiconductor material comprise a same semiconductor material;

a gate structure for the first transistor and the second transistor, wherein the gate structure comprises a first gate electrode for the first transistor and a second gate electrode for the second transistor, wherein the first gate electrode is positioned around at least portions of the first channel semiconductor material, the second gate electrode is positioned around at least portions of the second channel semiconductor material and wherein the first gate electrode and the second gate electrode comprise different materials, and a gate stack spacer positioned vertically between the first gate electrode and the second gate electrode so as to electrically isolate the first gate electrode from the second gate electrode.

12. The device of claim 11, wherein the first transistor is an N-type transistor and the second transistor is a P-type transistor.

13. The device of claim 11, wherein the first gate electrode comprises a first conductive material and the second gate electrode comprises a second conductive material, wherein the first conductive material is different from the second conductive material.

14. The device of claim 13, wherein the first conductive material comprises a plurality of layers of conductive material and the second conductive material comprises TiN.

15. The device of claim 13, wherein the first conductive material comprises a first work-function material and the second conductive material comprises a second work-function material.

16. The device of claim 12, wherein the gate structure further comprises a third conductive material that is conductively coupled to the first gate electrode and to the second gate electrode.

17. The device of claim 12, wherein the gate structure further comprises a third conductive material, the third conductive material comprising first and second portions that are electrically isolated from one another, wherein the first portion of the third conductive material is conductively coupled to the first gate electrode and the second portion of the third conductive material is conductively coupled to the second gate electrode.

18. A device, comprising:

a first transistor device of a first type;

a second transistor device of a second type positioned vertically above the first transistor device, wherein the first type and second type of transistors are opposite types;

a first channel semiconductor material for the first transistor device;

a second channel semiconductor material for the second transistor device;

a gate structure for the first transistor and the second transistor, wherein the gate structure comprises a first gate electrode for the first transistor and a second gate electrode for the second transistor, wherein the first gate electrode is positioned around at least portions of the first channel semiconductor material, the second gate electrode is positioned around at least portions of the second channel semiconductor material and wherein the first gate electrode and the second gate electrode comprise different materials, and a gate stack spacer positioned vertically between the first gate electrode and the second gate electrode so as to electrically isolate the first gate electrode from the second gate electrode.

19. The device of claim 18, wherein the first gate electrode comprise a first work-function material and the second gate electrode comprises a second work-function material, wherein the first work-function material and the second work-function material comprise different materials.

* * * * *